(12) United States Patent
Licitra et al.

(10) Patent No.: US 7,709,332 B2
(45) Date of Patent: May 4, 2010

(54) PROCESS FOR FABRICATING A FIELD-EFFECT TRANSISTOR WITH SELF-ALIGNED GATES

(75) Inventors: Christophe Licitra, Grenoble (FR); Bernard Previtali, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/224,624

(22) PCT Filed: Mar. 26, 2007

(86) PCT No.: PCT/FR2007/000520

§ 371 (c)(1),
(2), (4) Date: Sep. 2, 2008

(87) PCT Pub. No.: WO2007/110507

PCT Pub. Date: Oct. 4, 2007

(65) Prior Publication Data

US 2009/0011562 A1 Jan. 8, 2009

(30) Foreign Application Priority Data

Mar. 28, 2006 (FR) .................................. 06 02682

(51) Int. Cl.
*H01L 21/336* (2006.01)
(52) U.S. Cl. ................ 438/283; 438/311; 257/E21.623
(58) Field of Classification Search ................ 438/311, 438/197, 455, 459, 157, 142, 282, 283, 180, 438/229, 299; 257/E21.409, E21.623, E21.637
See application file for complete search history.

(56) References Cited

U.S. PATENT DOCUMENTS

| 6,365,465 | B1 | 4/2002 | Chan et al. |
| 7,022,562 | B2 | 4/2006 | Deleonibus |
| 2002/0160574 | A1 | 10/2002 | Zahurak et al. |
| 2004/0188760 | A1* | 9/2004 | Skotnicki et al. ............ 257/347 |
| 2005/0205934 | A1* | 9/2005 | Lochtefeld et al. .......... 257/347 |
| 2006/0022264 | A1 | 2/2006 | Mathew et al. |
| 2006/0022275 | A1 | 2/2006 | Ilicali et al. |
| 2006/0027881 | A1* | 2/2006 | Ilicali et al. ................. 257/401 |

FOREIGN PATENT DOCUMENTS

| FR | 2 829 294 | 3/2003 |
| WO | WO 03/103035 A1 | 12/2003 |

\* cited by examiner

*Primary Examiner*—Khiem D Nguyen
(74) *Attorney, Agent, or Firm*—Oliff & Berridge, PLC

(57) ABSTRACT

A first gate, formed on a substrate, is surmounted by a hard layer designed, with first spacers surrounding the first gate, to act as etching mask to bound the channel and a pad that bounds a space subsequently used to form a gate cavity. The hard layer is preferably made of silicon nitride. Before flipping and bonding, a bounding layer, preferably made of amorphous silicon or polysilicon, is formed to bound drain and source areas. After flipping and bonding of the assembly on a second substrate, a second gate is formed in the gate cavity. At least partial silicidation of the bounding layer is then performed before the metal source and drain electrodes are produced.

13 Claims, 14 Drawing Sheets

PROCESS FOR FABRICATING A FIELD-EFFECT TRANSISTOR WITH SELF-ALIGNED GATES

BACKGROUND OF THE INVENTION

The invention relates to a method for producing a field-effect transistor of planar structure, with double self-aligned gates on each side of a channel and source and drain electrodes, comprising formation of a first gate on a first substrate of semi-conductor on insulator type, deposition on the first gate of a hard layer designed to act as etching mask to bound the channel and a pad that bounds a space subsequently used to form a gate cavity, flipping and bonding of the assembly on a second substrate and formation of a second gate in the gate cavity, photolithographic steps relating to definition of the gates, source and drain areas and channel areas being performed before bonding.

STATE OF THE ART

Various methods exist for fabricating double gate field-effect transistors (DGFET) of planar structure. In this type of transistor, preferably achieved on a silicon on insulator (SOI) substrate, first and second gates are respectively arranged on each side of a channel, in a direction parallel to the substrate.

A first known technique essentially uses bonding and transfer of layers. For example, in the document WO-A-03/103035, the bottom gate is first formed on a first substrate of SOI type. This bottom gate is then used as mask for producing the channel. After flipping and bonding of a second substrate, an active area is defined by photolithography and etching above the channel and bottom gate. Internal lateral spacers are then formed in the active area before the top gate is formed, the spacers controlling the width of this top gate. This fabrication method notably presents the following shortcomings:

- Selective etching, after flipping and bonding, of the bulk silicon block of the first substrate with stopping on a non-doped polysilicon layer is difficult to achieve as the two materials have very close physical-chemical properties.
- The lateral drain-channel or source-channel contact is one of the weak points of this method. Following de-oxidation of the cavity in which the drain or source is to be formed, deposition of the gate insulator and, in the worst case, of the internal nitride spacer, can in fact partially obstruct the future drain-channel or source-channel contact area. The gate insulator and/or the nitride can therefore prevent drain-channel or source-channel connection.
- The dimensions of the final active area are defined by photolithography and etching after bonding which generates mechanical strains on the substrate, increasing the uncertainty of alignment of the active area with the gates.
- Elimination of the short-circuit between the source and drain after simultaneous formation of the latter by deposition is not clearly defined.

In U.S. Pat. No. 6,365,465, a suspended silicon channel is first formed between the source and drain area. The top and bottom gates are then defined by photolithography. This fabrication method notably presents the following shortcomings:

- The two gates are of different sizes. The length of the bottom gate is in fact equal to the difference between the distance separating the drain and source and twice the thickness of the gate insulator, whereas the length of the top gate is determined by the mask when lithography of the gates is performed.
- The two gates are not really self-aligned. If the lithography of the gate level is greatly offset with respect to the prior lithography of the drain and source level, covering of the gates may in fact not be total. Centering of the two gates, which relies on alignment of two photolithography levels, is all the more difficult the smaller the dimensions, in particular when the gate length is smaller than 20 nm, for example about 10 nm.
- The source and drain are only insulated from the gates by a gate insulator layer, without the possibility of forming spacers, which implies strong stray capacitances between the gates and source and between the gates and drain.
- The gates cannot be polarized independently as they in practice form a single gate structure surrounding the whole channel and not two gates insulated from one another.
- The distance between the source and drain areas formed by photolithography, and consequently the gate lengths, are difficult to reduce by conventional high-resolution ebeam lithography or photolithography methods in which precision is limited by the resolution of the associated mask.

For very small gate lengths for example of about 10 nm, this fabrication method therefore means that two photolithography operations have to be performed, which are both critical in so far as they have to enable patterns of very small dimensions to be obtained with stringent alignment criteria between these two photolithography levels.

In the document FR-A-2829294, the top gate is used as mask to produce the channel and bottom gate. Multiple spacers extend the top gate when etching of the channel is performed, the channel when etching of the bottom gate is performed, and insulate the bottom gate from the source and drain. This fabrication method notably presents the following shortcomings:

- The two gates are of different sizes.
- The size of the rear gate formed by lateral etching is very difficult to control.

Measurement of the length of the bottom gate is in fact only possible by destructive testing.

US Patent 2006/022264 describes production of a transistor with double self-aligned gates with flipping and bonding of a first gate on a second substrate, without photolithography after bonding with source and drain areas made from silicide semi-conducting material.

OBJECT OF THE INVENTION

The object of the invention is to provide a method that does not present these shortcomings for fabrication of a double gate field-effect transistor with a planar structure in which the gates are self-aligned and of the same size.

According to the invention, this object is achieved by the appended claims and more particularly by the fact that the source and drain electrodes being metallic, the fabrication method comprises, subsequent to bonding, at least partial silicidation of the layers making the electric connection between the portion of channel situated between the self-aligned gates and the future source and drain electrodes, followed by deposition of a metal to form the source and drain electrodes.

According to a development of the invention, the method successively comprises:
- formation, on the first substrate comprising a buried insulator layer, of a first layer made from semiconductor material in which the channel will be formed,
- subdivision into an insulating area and an active area by lateral boundary of the active area in the first layer of semiconductor material,
- fabrication of a gate stack, on a part of each of said areas, designed to form the first gate and comprising at least said hard layer at its top part,
- formation of first lateral spacers, from insulating material, around the gate stack,
- etching of the first layer of semiconductor material and, at least partially, of the buried insulator layer, with use of the hard layer of the gate stack and of the first spacers as etching mask,
- covering the whole insulating area with an insulator,
- bounding source and drain areas by deposition of a bounding layer,
- bonding the assembly to a second substrate and flipping the latter,
- removing the first substrate and first buried insulator layer so as to form, for the second gate, said gate cavity bounded by the bounding layer above the first gate,
- deposition of a gate insulator layer in the bottom of the gate cavity,
- fabricating lateral internal spacers in the gate cavity,
- fabricating the second gate in the gate cavity and
- fabricating the source and drain in the source and drain areas.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

Figure 1:
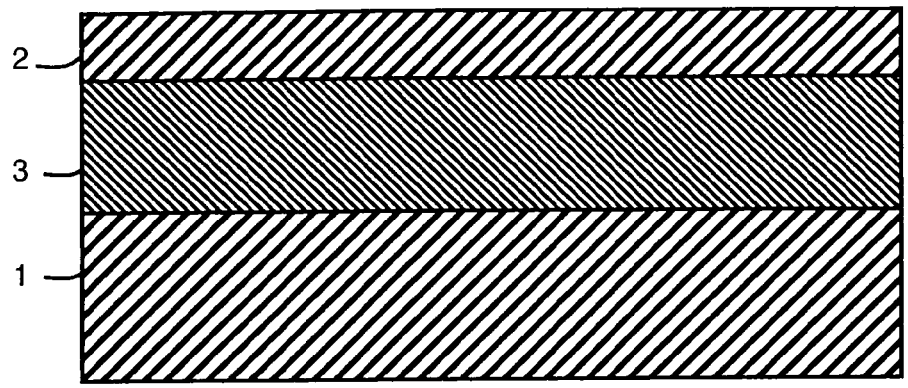
FIGS. 1 to 7, 9 to 15, 17, 18, 20 to 22 and 24 to 26 illustrate the transistor, in cross-section, in the various successive steps of a particular embodiment of the method according to the invention.

As represented in FIG. 1, fabrication of the field-effect transistor in conventional manner uses a base substrate constituted by forming a film 2 of conductor material on a buried insulator 3 on a first substrate 1 constituting a mechanical support substrate. First substrate 1 is for example made from bulk silicon and film 2 is formed by a thin layer (for example with a thickness of 50 to 200 nm) of silicon, germanium or SiGe so as to form a silicon on insulator (SOI), germanium on insulator (GeOI), or SiGe on insulator (SiGeOI) base substrate. Buried insulator 3 is for example formed by a buried oxide layer with a thickness of 100 to 400 nm. This base substrate which is available on the market is not necessarily produced at the same time as fabrication of the transistor.

Figure 2:
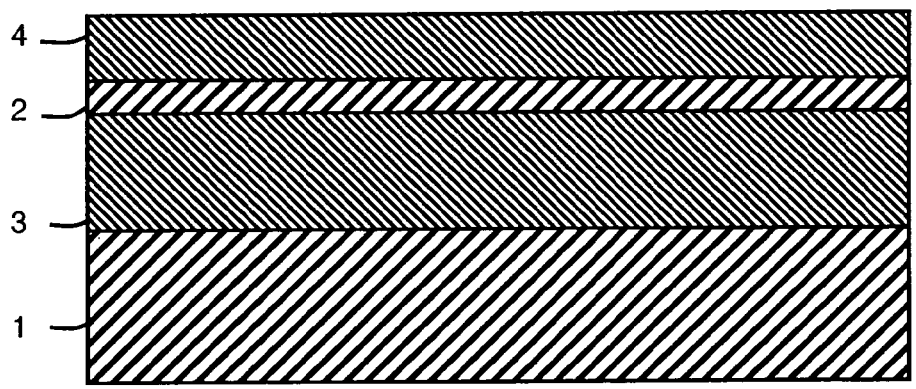
Figure 3:
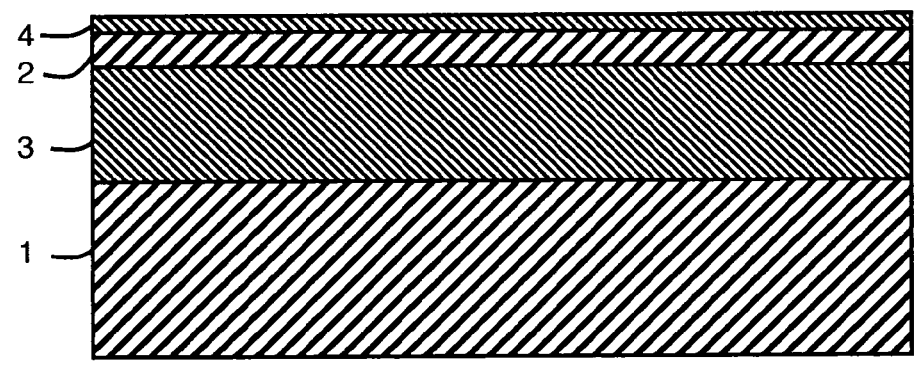

Film 2 is then preferably thinned, conventionally by oxidation (formation of an oxide layer 4, as represented in FIG. 2) and de-oxidation (as represented in FIG. 3). For gate lengths of less than 20 nm, with a gate insulator having an EOT (equivalent oxide thickness) or electric thickness equivalent to 1 nm, the thickness of film 2 is preferably comprised between 5 and 10 nm after thinning.

Figure 4:
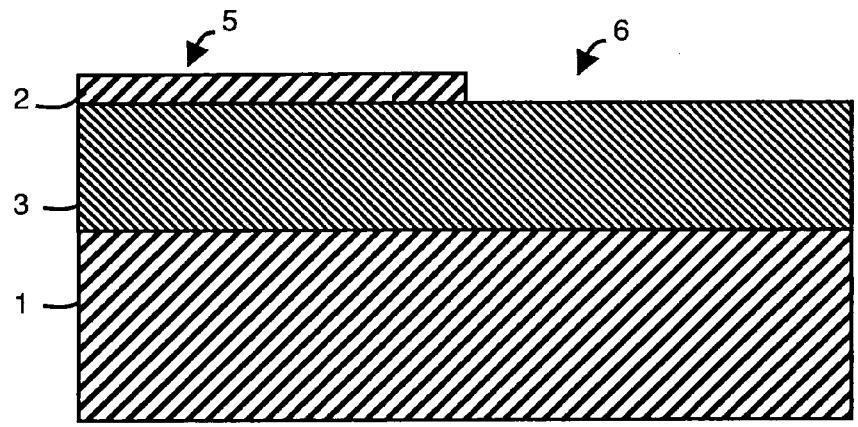
Figure 8:
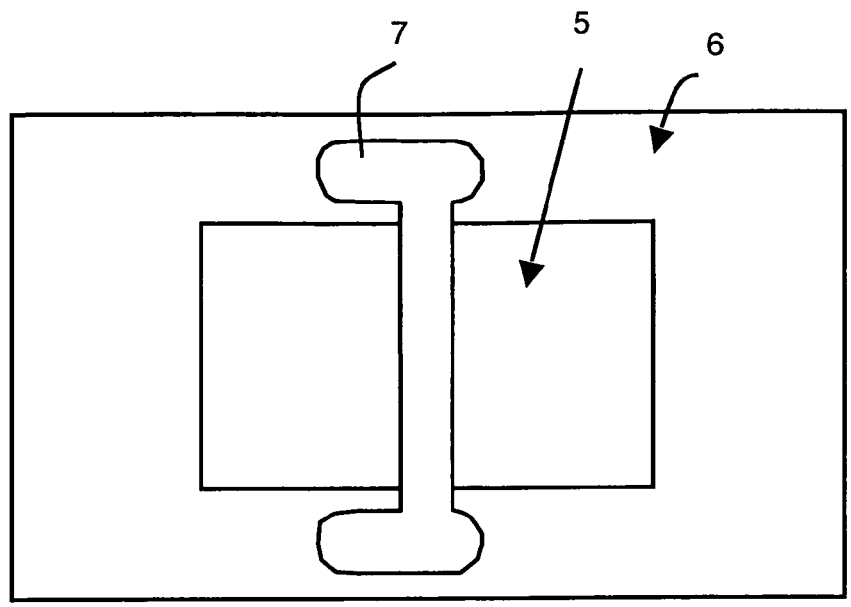
FIGS. 8, 16, 19, 23 and 27 respectively represent the device according to FIGS. 7, 15, 18, 22 and 26 in top view.

An active area 5 of the transistor is then laterally bounded (FIGS. 4 and 8) in film 2 in conventional manner. This boundary is for example obtained by photolithography (deposition of a photoresist layer on layer 4, formation of a mask corresponding to the active layer in the photoresist layer) followed by etching up to insulator 3 of the areas of layer 4 and of film 2 not covered by the photoresist mask and removal of layer 4. The assembly is thereby subdivided into 2 areas: active area 5 and an insulating area 6.

Figure 5:
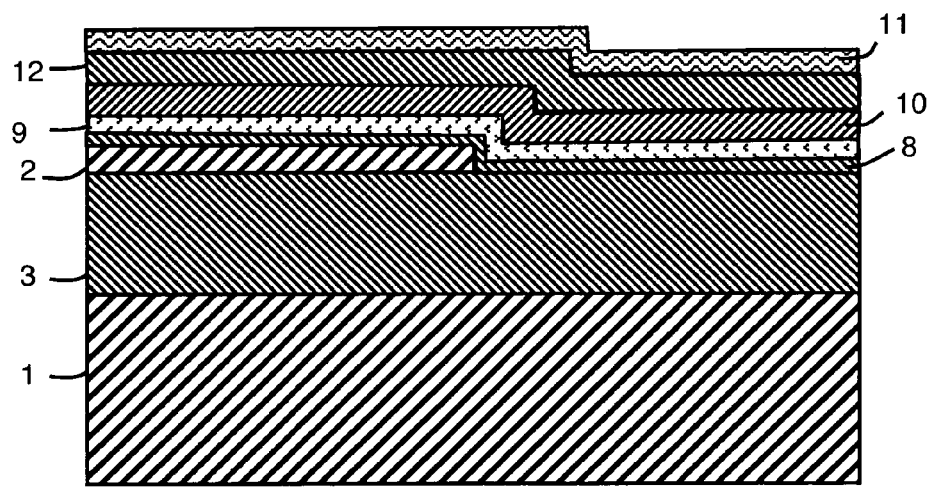
Figure 6:
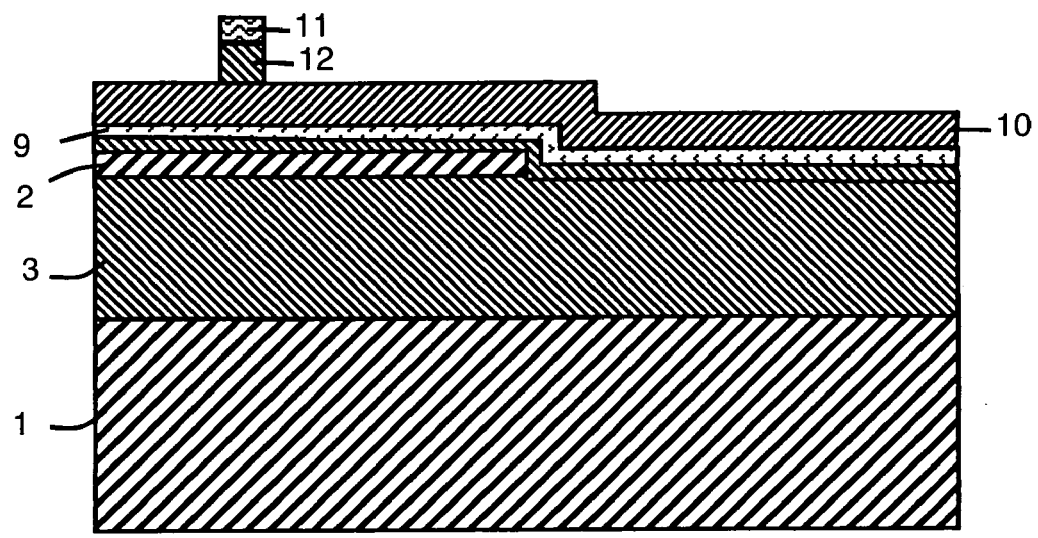
Figure 7:
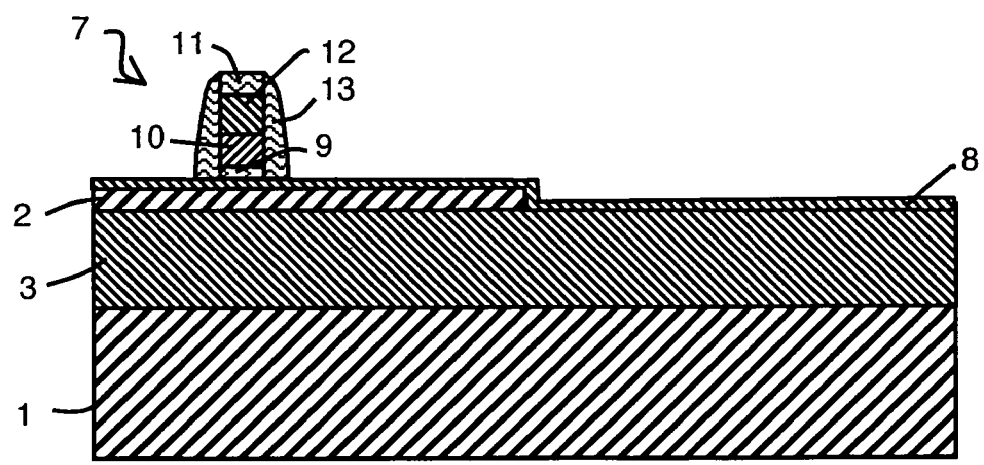

A first gate stack is then made at the same time on a part of each of the areas (see FIG. 8) to form a first gate 7 designed to constitute the bottom gate of the transistor. This gate stack is formed by deposition and etching with a hard mask, for example made of nitride, as illustrated in FIGS. 5 to 7, for the part of the gate stack situated on active area 5. The parts of the gate stack situated on insulating area 6 are only represented in FIG. 8. In top view, first gate 7 is substantially I-shaped, with a central bar passing right through active area 5 and extending into insulating area 6. In this insulating area, this central bar is if required completed at its ends by two transverse bars to enhance contact being made independently on each gate.

In the particular embodiment illustrated in FIG. 5, the stack is first of all formed by successive deposition of:
- an insulating layer 8 designed to form the gate insulator,
- a layer 9 of titanium nitride (TiN) under a layer 10 of polysilicon, constituting the gate materials, and
- at least one hard layer 11, for example made from silicon nitride, that may be formed on an insulating sub-layer 12, for example made of HTO ("high temperature oxide"), to form the hard mask. The material constituting hard layer 11 must be resistant to oxide etchings.

Insulating layer 8 can be made from any suitable insulating material, for example silicon oxide ($SiO_2$), hafnium oxide ($HfO_2$) or high-K aluminum oxide (high-K $Al_2O_3$). Other metals such as tungsten can also be used to form the gate materials (WSi, Ti, W, WN, Ta, TaN . . . ).

As represented in FIG. 6, the mask is then formed in layers 11 and 12, for example by photolithography and etching. This photolithography is the only critical photolithography (i.e. designed to obtain patterns of very small dimensions, for example about 10 nm) of the method. Its alignment does not pose any particular problems and can be performed in standard manner in so far as the dimensions of active area 5 on which the gate is to be formed are large compared with the length of the gate to be formed. For example, an alignment deviation of about 30 nm can be tolerated for a gate length of about 10 nm for active area dimensions of about 300 nm.

Layers 9 and 10 of the gate stack are then etched using the hard mask, which is kept to obtain a gate stack of required shape comprising at least one hard layer at the top part thereof, above the gate insulator 8. Extensions can then be implanted, with or without spacers (not shown).

Then, as represented in FIG. 7, lateral spacers 13 made of insulating material are formed around the gate stack, for example by deposition and etching. The insulating material is preferably the same as that used for the hard mask, for example nitride. The gate stack is then totally encapsulated in the nitride (layer 11 of the mask and spacers 13) and forms first gate 7, illustrated in top view in FIG. 8.

Figure 9:
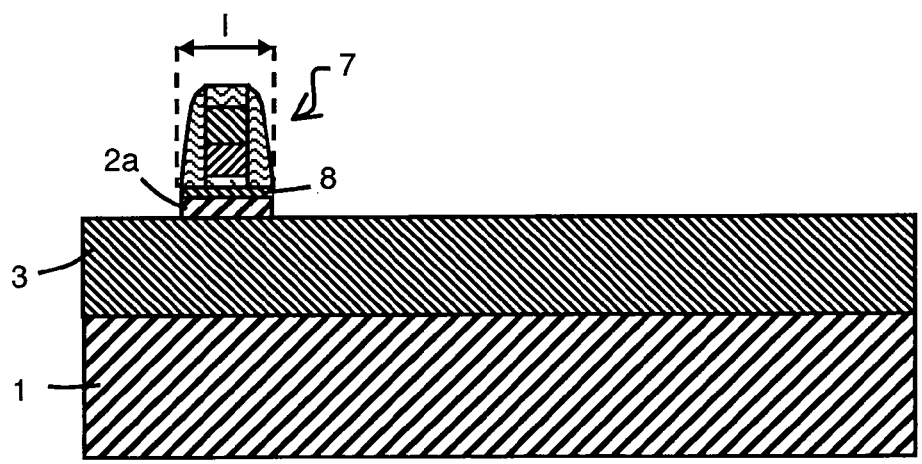
Figure 10:
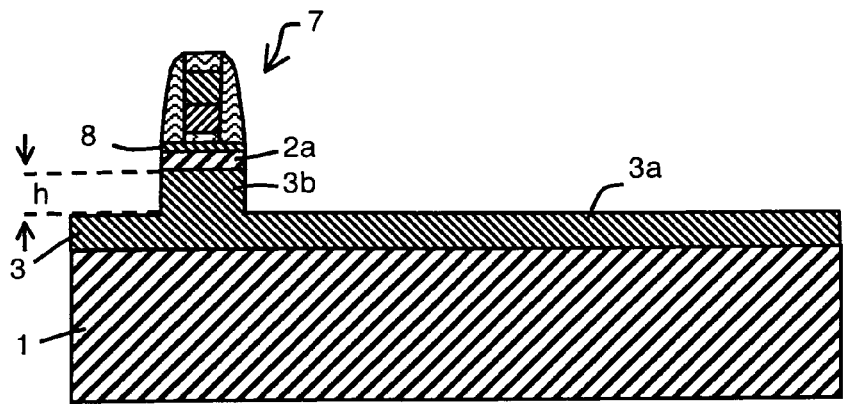

As represented in FIG. 9, channel 2a of the transistor, of length l, is then bounded by etching of insulating layer 8 and of layer 2 using first gate 7 as etching mask, i.e. its top hard layer 11 and its lateral spacers 13. The same mask is used to at least partially etch buried insulator 3. In FIG. 10, buried insulator 3 is only removed over a part of its thickness. A thin non-etched layer 3a of buried insulator therefore remains, topped with a salient pad of width l and height h on this layer, under the mask only. For a common gate height of 50 nm, the buried insulator is preferably etched over a height h of about 150 nm. In active area 5, pad 3b is thus disposed under channel 2a, whereas in insulating area 6, pad 3b is disposed directly under the gate insulator. This pad 3b bounds a space which will be subsequently used to form a cavity for embedding a top gate, after first substrate 1 and buried insulator 3 have been removed.

Implant and improvement of the electrical properties of extensions can be performed in this step, for example by SiGe epitaxy at the channel edge.

Figure 11:
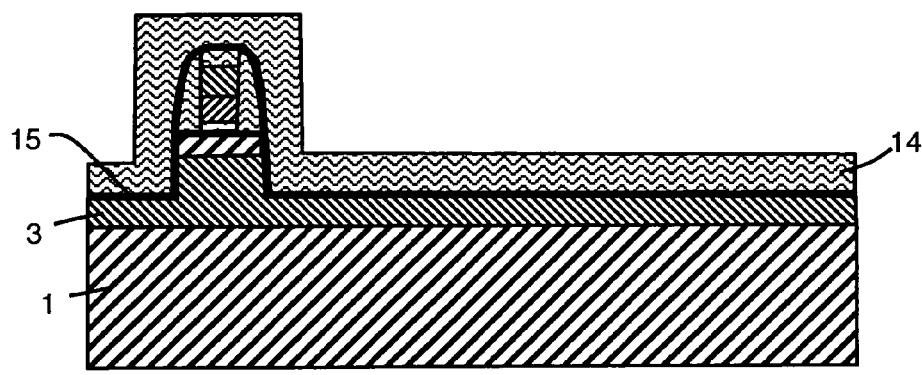
Figure 12:
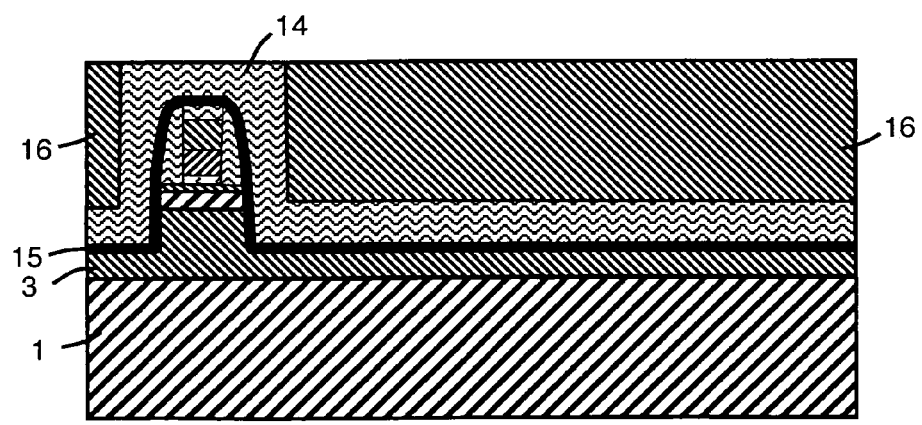
Figure 13:
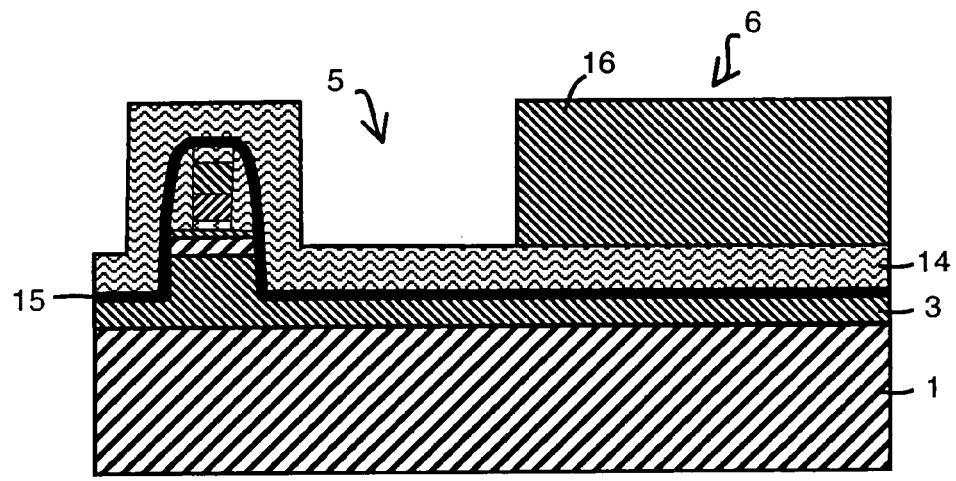
Figure 14:
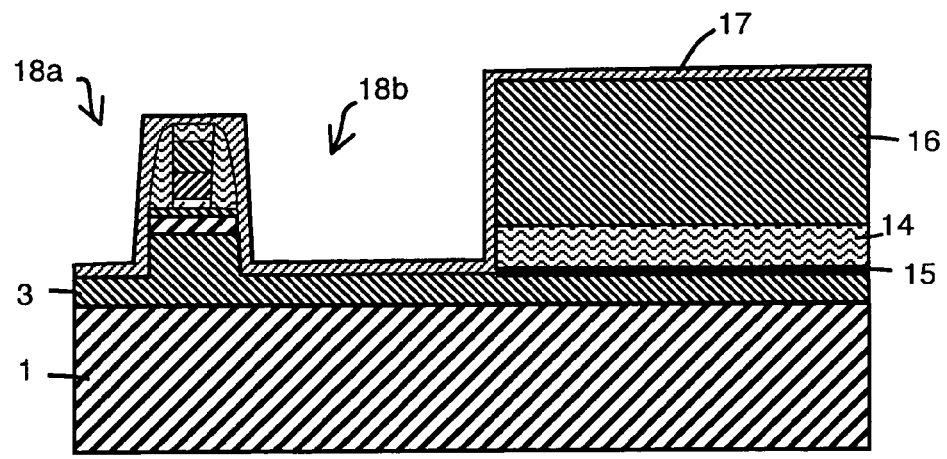

After the whole of the insulating area has been covered by an insulator, source and drain areas are then bounded by deposition of a bounding layer. In the particular embodiment represented in FIGS. 11 to 16, a stop layer 14, preferably made of thick nitride (for example 100 nm) is deposited, preferably on a very thin sub-layer of oxide 15 (HTO for example), on the whole of the component, thereby covering gate 7 and its spacers 13 and the remaining buried insulator 3 (FIG. 11), in both active area 5 and insulating area 6. Then an insulator 16 (preferably $SiO_2$) is deposited such as to encapsulate the assembly formed in this way, after chemical mechanical polishing with stopping on nitride (FIG. 12). Insulator 16 is then removed in active area 5, for example by photolithography and etching with stopping on nitride (FIG. 14). Insulator 16 then covers the whole of insulating area 6.

The stop on nitride layer 14 and thin sub-layer 15 are then removed in active area 5, and a bounding layer 17 is deposited on the assembly in the active and insulating areas (FIG. 14), and comes directly into contact with the side walls of channel 2a. Bounding layer 17 is made from a material having a significant etching selectivity (by chemical etching, plasma or chemical mechanical polishing) compared with the material forming stop layer 14, these two materials having a significant etching selectivity compared with the silicon oxide forming insulator 16. For a stop layer 14 made of silicon nitride, bounding layer 17 is preferably made from semiconductor material such as silicon, germanium or silicon-germanium alloys, for example amorphous silicon, or poly-silicon, or from conductor material such as titanium nitride (TiN). The stop and bounding layers can also be formed by nitrides of different stoichiometries enabling a difference of etching rate to be obtained, for example $Si_3N_4$ SiN.

In the case where bounding layer 17 is made from silicon, it can be formed by non-selective epitaxy or LPCVD deposition. Its thickness is for example about 20 nm. In the advantageous case where bounding layer 17 is deposited by non-selective epitaxy, the deposited silicon is monocrystalline in contact with the channel and there is then a continuity of the crystalline lattice between the channel and this portion of bounding layer 17, and polycrystalline or amorphous elsewhere. The deposition conditions of the epitaxy process will define whether deposition will be amorphous or polycrystalline outside the contact area with the channel. The crystallinity of layer 17, outside these monocrystalline portions, is not specifically monitored. The thickness of the bounding layer outside the monocrystalline areas is ideally comprised between 5 and 10 nm.

Figure 15:
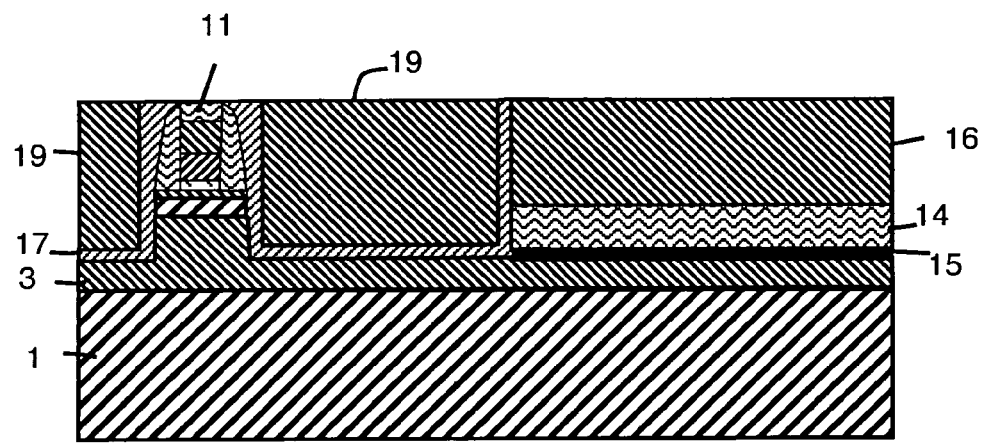
Figure 16:
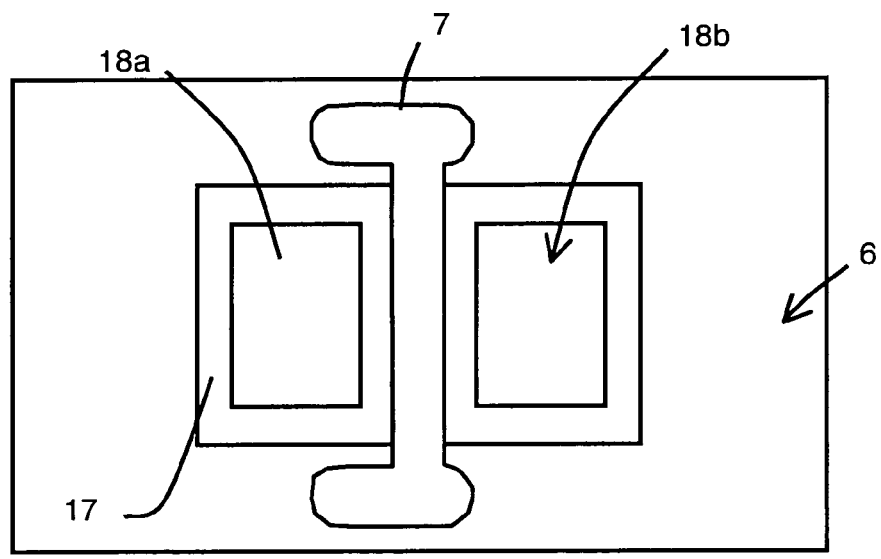

As represented in FIGS. 14 to 16, two dishes 18a and 18b, bounded by bounding layer 17 were formed in this way in the active area around first gate 7. They bound the future source and drain areas of the transistor. The assembly is then encapsulated in silicon oxide 19, and the top part of silicon bounding layer 17 is removed by chemical mechanical polishing with stopping on hard nitride layer 11 situated above first gate 7 in the active area (FIG. 15). A potential short-circuit between source and drain is thereby eliminated.

Figure 17:
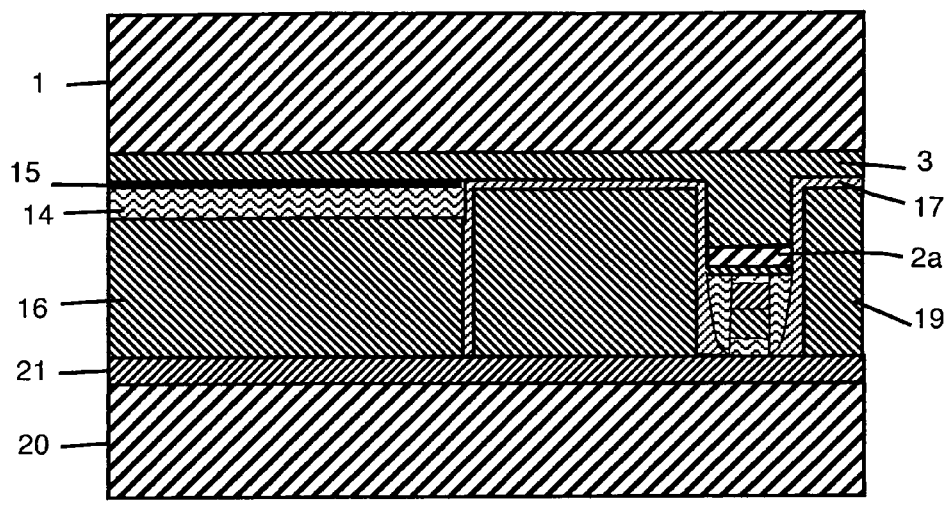

All the critical photolithography steps have henceforth been completed. The assembly is then bonded to a second substrate 20 and flipped. This bonding and flipping step is conventionally performed by deposition of a silicon oxide ($SiO_2$) layer on the assembly, oxide-oxide bonding on a transfer substrate 20 provided with an oxide layer. The two oxide layers bonded in this way form a buried insulator layer 21 of second substrate 20 (FIG. 17). The bonding interface is preferably at a distance of at least 350 nm from top layers 15 and 17. This relatively large distance prevents imperfections of the bonded surface from affecting the transistor and prevents this interface from being liable to come unbonded during a subsequent step.

Figure 18:
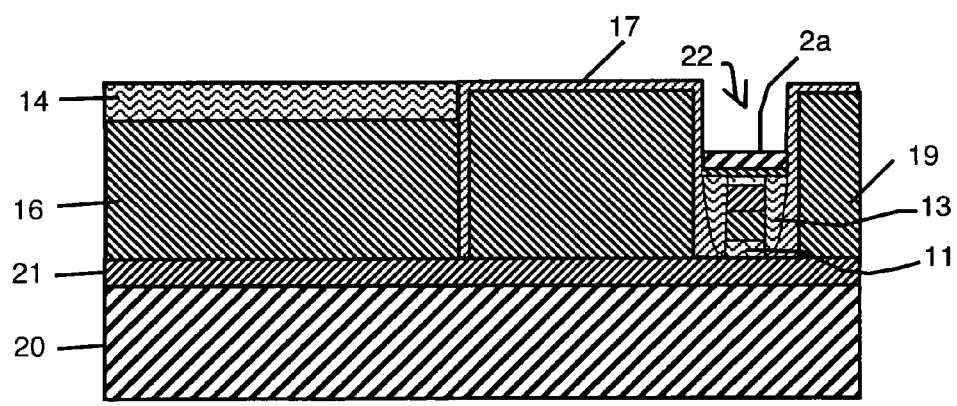
Figure 19:
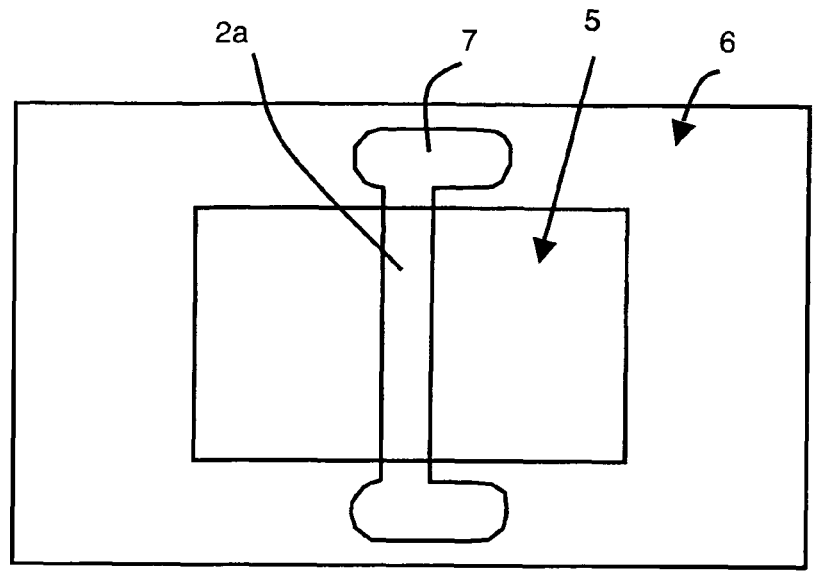

First substrate 1 is then removed. Then buried insulator 3 associated with the first substrate is eliminated by etching (FIGS. 18 and 19), at the same time as thin layer 15 of HTO of insulating area 6. Around gate 7, the top part of the transistor is then formed by stop layer 14 in insulating area 6 and by bounding layer 17 in the active area. At the level of the gate, the latter is surmounted by channel 2a in active area 5. As represented in FIGS. 18 and 19, a gate cavity 22 for the second gate is thereby bounded by bounding layer 17 above first gate 7, i.e. above channel 2a in the active area and directly above gate insulator 8 in the insulating area.

Figure 20:
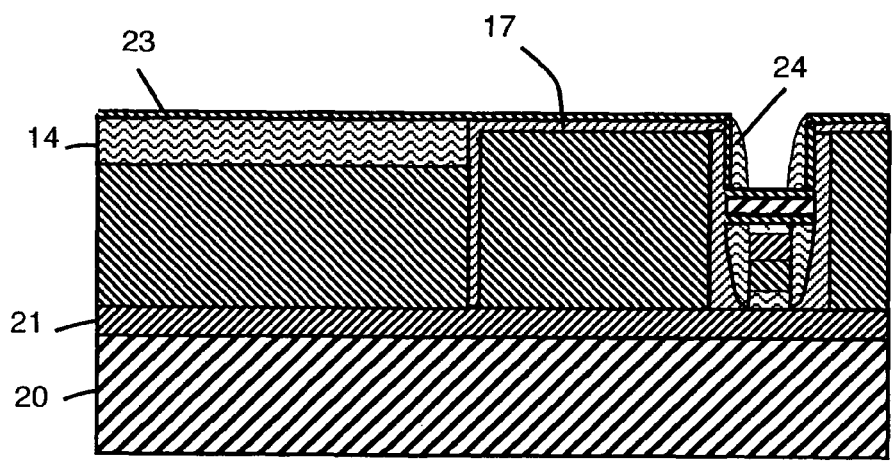

A layer 23 forming the second gate insulator is then deposited at the bottom of gate cavity 22. In the particular embodiment of FIG. 20, layer 23 of insulator (HfO2 for example) is deposited on the whole assembly. Lateral internal spacers 24 are then formed in gate cavity 22. These internal spacers 24 bound the length of the second gate (top gate). Their thickness is adjusted so that the top gate has the same dimension as the bottom gate, the latter having been able to be measured before bonding and flipping.

Figure 21:
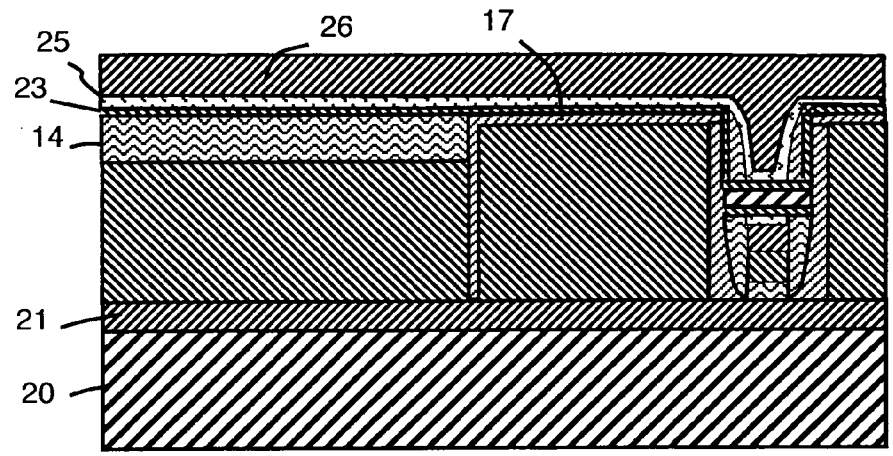

The second gate or top gate is then produced in gate cavity 22. In the particular embodiment illustrated in FIGS. 21 and 22, the gate materials are formed by a layer 25 of titanium nitride (TiN) deposited under a polysilicon layer 26. The gate materials of the top gate can, for certain applications, be different from the gate materials of the bottom gate. In this case, the asymmetry of the gates for example enables the threshold voltage of the transistor to be adjusted.

Figure 22:
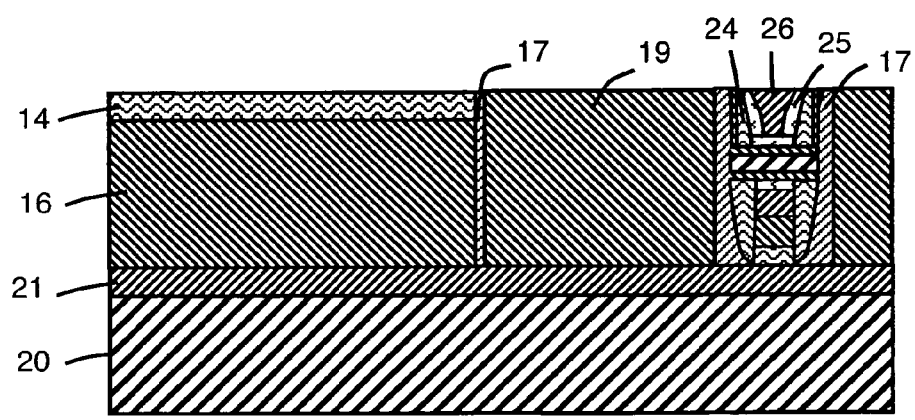
Figure 23:
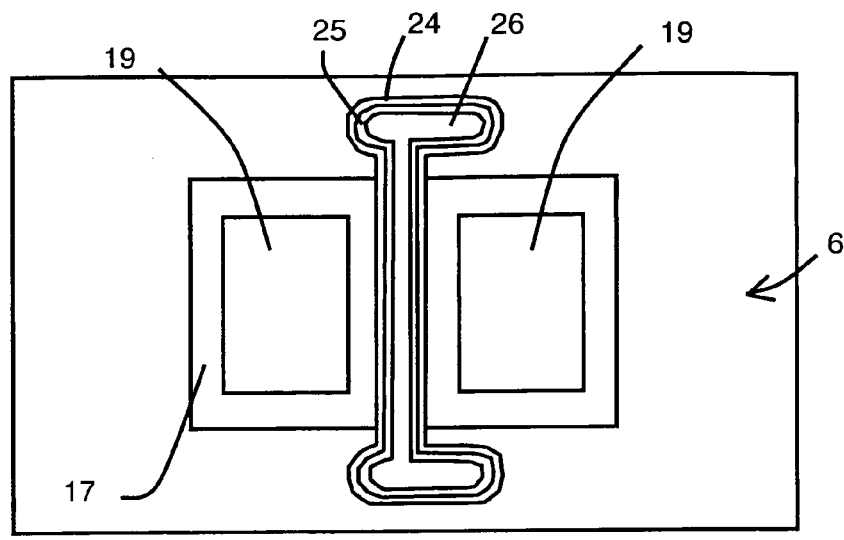

Chemical mechanical polishing with selective stopping on nitride (stop layer 14) then enables the top gates of simultaneously formed adjacent transistors to be insulated. The small thickness of bounding layer 17 in the active area compared with the thickness of stop layer 14 in the insulating area enables bounding layer 17 to be removed at the top part of the active area. In the insulating area, stop layer 14 has a sufficient thickness not to be totally removed when polishing is performed. As represented in FIGS. 22 and 23, around the top gate, the thinned stop layer 14 then covers the insulating area, whereas the encapsulation oxide 19 filling dishes 18a and 18b comes flush in the active area. The remaining parts of bounding layer 17 form a vertical separating wall between the active and insulating areas and encapsulate the bottom and top gates.

Figure 24:
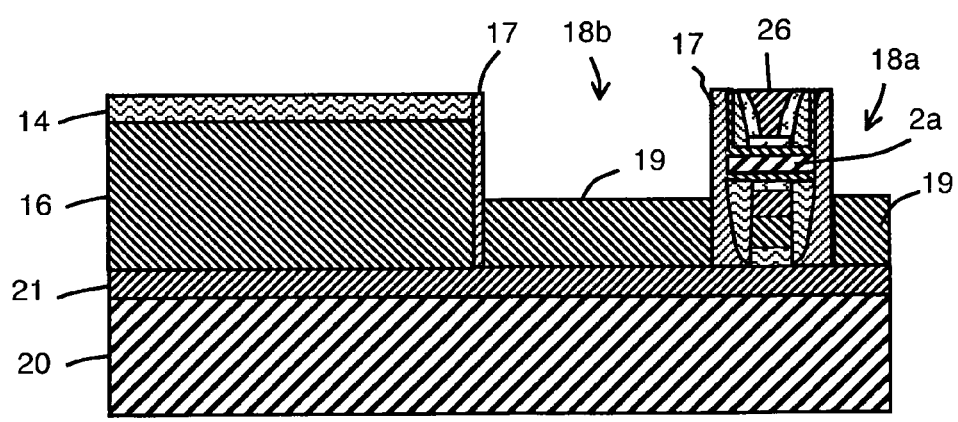

The source and drain are then made in the source and drain areas bounded by dishes 18a and 18b. In the particular embodiment illustrated in FIGS. 24 to 27, oxide 19 filling dishes 18a and 18b bounding the source and drain areas is at least partially etched (FIG. 24), whereas the insulating area remains protected by stop layer 14 and the vertical separating walls formed by bounding layer 17 of amorphous silicon or polysilicon. Etching must be sufficiently deep to uncover channel 2a.

Then, in a silicidation step (FIG. 25), the parts of bounding layer 17 uncovered when etching of silicon oxide 19 was performed are silicided. This is in particular the case of the parts in contact with the top gate, channel 2a and at least a part of the bottom gate. In so far as the top gate contains apparent polysilicon as gate material (layer 26), the latter is silicided simultaneously. It is important to underline the fact that the silicide layer is situated on the edges of the channel.

In certain embodiments, the silicide layer is situated under all or part of spacers 24, 13. For example between 3 and 6 nm of platinum are deposited to form 10 nm of platinum silicide in known manner, and the platinum silicide will thus penetrate under spacers (24, 13) themselves of equivalent length to that of the gate, i.e. about 10 nm.

Figure 25:
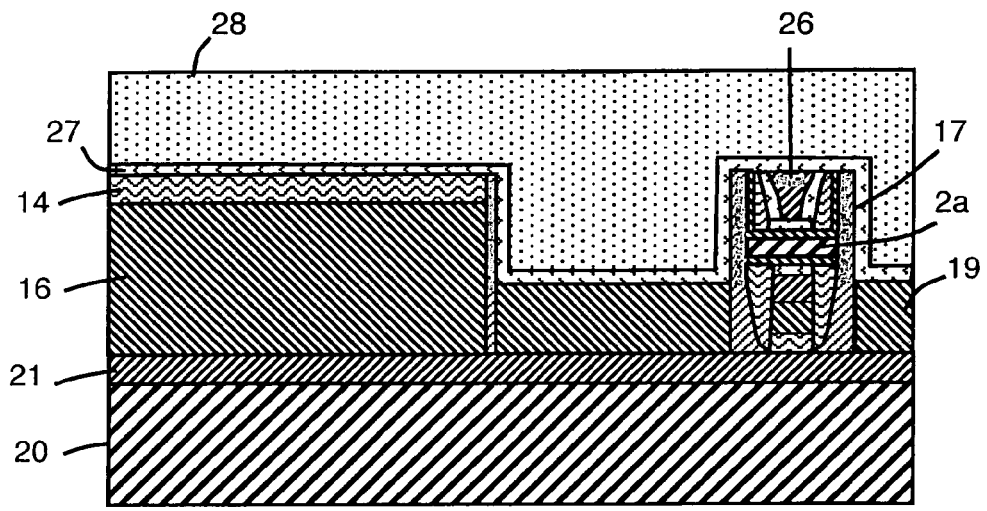

Source and drain materials are then deposited on the assembly. In FIG. 25, they are formed by a sub-layer 27 made of titanium nitride (TiN) on which a thicker layer 28 of tungsten (W) or tungsten and silicon alloy (WSi) is deposited, in the case where the source and drain are metallic.

Bounding layer 17 having preferably been deposited such as to ensure crystallographic continuity with the channel over a portion in contact with the channel and to thereby form a continuous film in each source and drain area, this results in this particularly advantageous configuration enabling a good electric contact to be achieved between the future source and drain electrodes and the channel. There is in fact always a continuity of freshly silicided bounding layer 17 with channel 2a and there is no insulating interface between channel 2a and the source and drain electrodes. Under these conditions, the access resistance is optimized.

Figure 26:
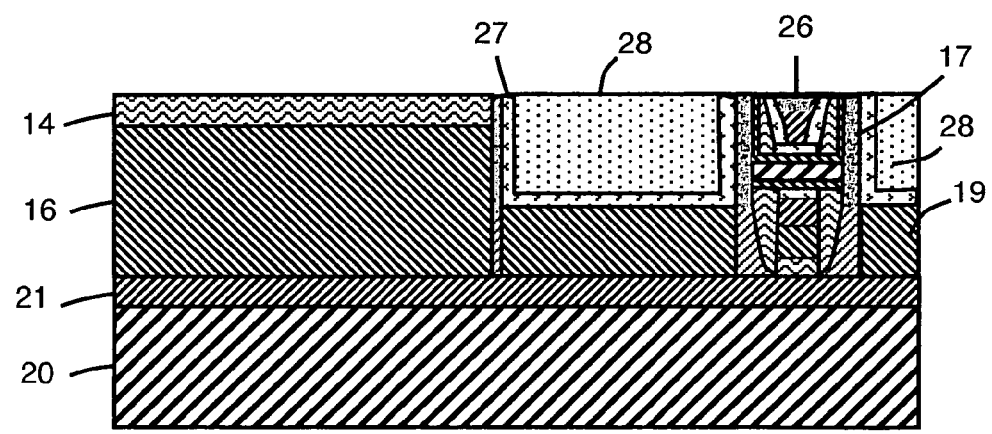
Figure 27:
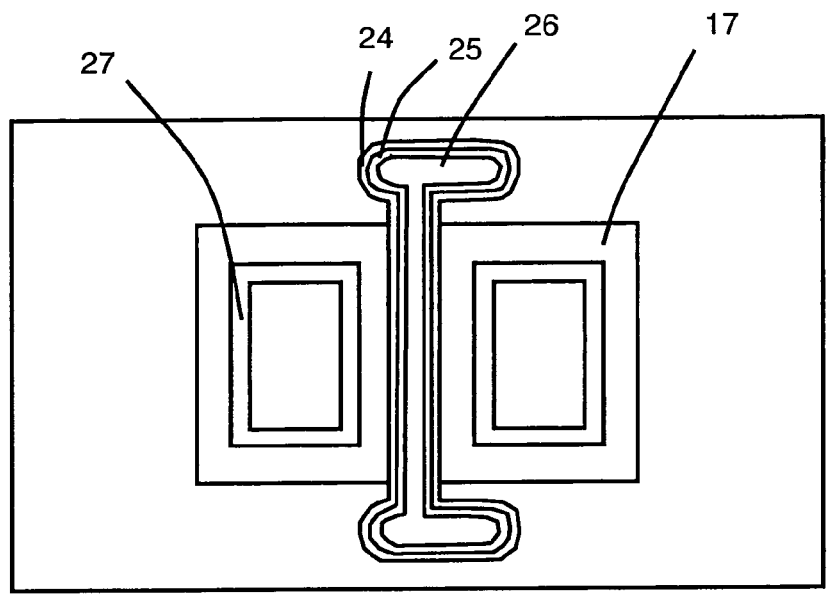

As represented in FIGS. 26 and 27, chemical mechanical polishing with stopping on nitride (stopping on stop layer 14) then enables the source and drain materials to be eliminated in the insulating area (on stop layer 14) and on the top gate in the active area, thereby separating the source from the drain.

The gate and source/drain contact connections are then made in conventional manner. An additional photolithography operation may be used to form independent contacts on the bottom and top gates so as to enable independent testing of the two gates.

Figure 28:
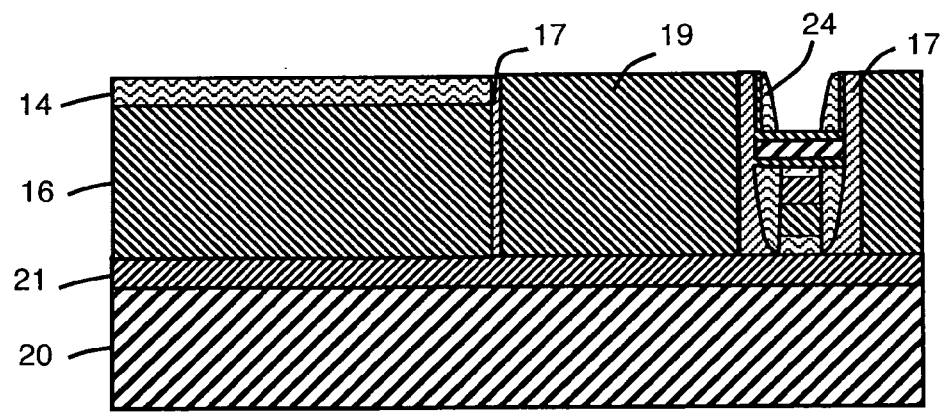
FIGS. 28 to 30 illustrate the steps of formation of the top gate, source and drain in an alternative embodiment with a metallic top gate.
Figure 29:
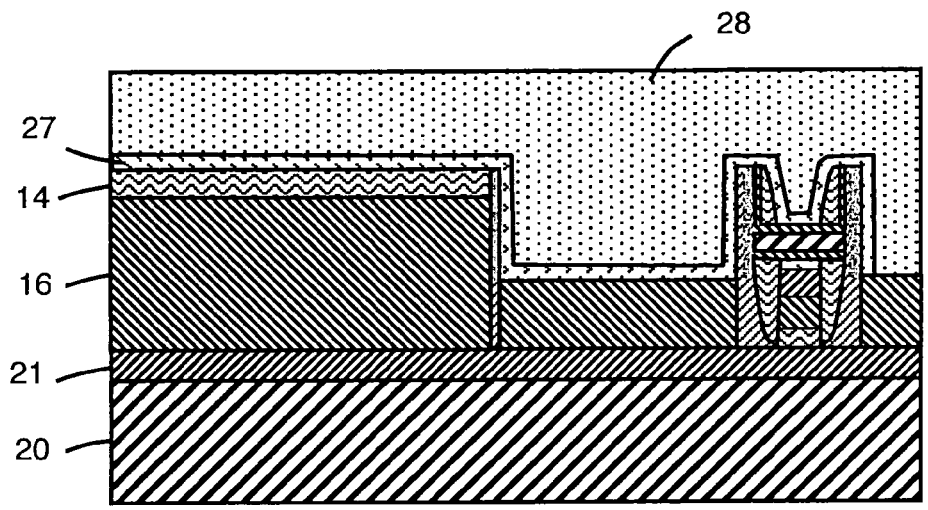
Figure 30:
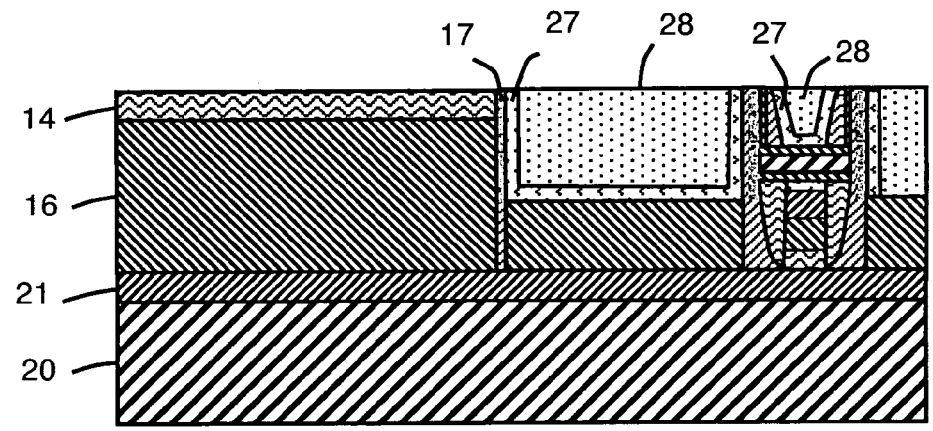

In an alternative embodiment, the top gate can be metallic. In this case, the top gate, source and drain can be filled simultaneously with the same materials. The method is then unchanged up to the step illustrated in FIG. 20. Then, after chemical mechanical polishing with stopping on stop layer 14, i.e. stopping on nitride (FIG. 28) as in FIG. 22 and partial etching of oxide 19 to form dishes as in FIG. 24, the polysilicon (layer 17) is silicided and metallic layers 27 (TiN) and 28 (W or WSi) forming the gate, source and drain materials are successively deposited on the assembly (FIG. 29). Chemical mechanical polishing with stopping on nitride enables the gate, drain and source to be separated, as illustrated in FIG. 30.

In another alternative embodiment, when the etching represented in FIG. 10 is performed, buried insulator 3 may be totally eliminated with the exception of the pads situated under gate 7. The fabrication method then remains unchanged up to the step represented in FIG. 24. However, stop layer 14 is then preferably a silicon nitride $Si_3N_4$ layer with a thickness of 10 nm and bounding layer 17 is a layer of SiN with a thickness of 20 nm. Moreover, after formation of dishes 18a and 18b bounding the source and drain areas (FIG. 24), SiN bounding layer 17 is etched on the uncovered side walls of the dishes, thereby uncovering channel 2a. The following fabrication steps are unchanged.

In another alternative embodiment, after formation of dishes 18a and 18b and etching of bounding layer 17 in the uncovered parts, the source and drain can be achieved by silicon epitaxy from channel 2a.

In all cases, first gate 7, formed on a substrate of semiconductor on insulator type, is covered by a hard layer 11 designed to act as etching mask to bound channel 2a and a pad 3b that bounds a space subsequently used to form a gate cavity 22. After flipping and bonding of the assembly on a second substrate 20, the second gate is formed in gate cavity 22. The drain and source areas are bounded before flipping and bonding by a bounding layer 17, preferably made of amorphous silicon or polysilicon.

The invention claimed is:

1. A method for producing a field-effect transistor of planar structure, with double self-aligned gates on each side of a channel and metallic source and drain electrodes, wherein photolithographic steps relating to definition of the gates, source and drain areas and channel areas are all performed before bonding, the method comprising:
    (a) forming a first gate on a first substrate of semi-conductor on insulator type,
    (b) depositing on the first gate a hard layer designed to act as etching mask to bound the channel and a pad that bounds a space subsequently used to form a gate cavity,
    (c) flipping and bonding of an assembly formed from steps (a) and (b) on a second substrate and fabricating a second gate in the gate cavity,
    (d) etching the assembly to expose a portion of a bounding layer to form a source recess and a drain recess,
    (e) siliciding the portion of the bounding layer exposed after etching to make an electric connection between the portion of channel situated between the self-aligned gates and the future source and drain electrodes, and
    (f) depositing a metal in the source recess and the drain recess to form the entirely metallic source and drain electrodes after step (e).

2. The method according to claim 1, wherein bounding of the source and drain areas is performed by depositing the bounding layer.

3. The method according to claim 1, successively comprising
    forming, on the first substrate comprising a buried insulator layer, a first layer made from semiconductor material in which the channel will be formed,
    subdividing the active area in the first layer of semiconductor material into an insulating area and an active area by lateral boundary,
    fabricating a gate stack, on a part of each of said areas, designed to form the first gate and comprising at least said hard layer at its top part,
    forming first lateral spacers, from insulating material, around the gate stack,
    etching the first layer of semiconductor material and, at least partially, the buried insulator layer, with use of the hard layer of the gate stack and of the first spacers as etching mask,
    covering the whole insulating area with an insulator,
    bounding source and drain areas by depositing the bounding layer,
    bonding the assembly to a second substrate and flipping the latter, removing the first substrate and the first buried insulator layer so as to form, for the second gate, said gate cavity bounded by the bounding layer above the first gate, depositing a gate insulator layer in the bottom of the gate cavity, fabricating lateral internal spacers in the gate cavity, fabricating the second gate in the gate cavity and fabricating the source and drain in the source and drain areas.

4. The method according to claim 3, comprising depositing a stop layer before covering the whole of the insulating area by the insulator.

5. The method according to claim 4, wherein the stop layer is made from nitride.

6. The method according to claim 4, wherein said covering of the insulating area layer comprises encapsulating the assembly by an insulating layer and selective etching of said insulating layer in the active area with stopping on the stop layer.

7. The method according to claim 4, wherein fabricating the second gate comprises:

filling the gate cavity with at least one gate material, and chemical mechanical polishing with selective stopping on the stop layer so as to remove the bounding layer on the active area and to at least partially keep the stop layer in the insulating area.

8. The method according to claim 2, wherein the bounding layer is made of amorphous silicon or of polysilicon.

9. The method according to claim 3, wherein the source and drain areas being filled with an encapsulation insulator before flipping and bonding, fabricating the source and drain comprises:

etching at least a part of the encapsulation insulator, depositing source and drain materials and chemical mechanical polishing so as to separate the source and drain.

10. The method according to claim 3, wherein the source and drain are formed by epitaxy from the channel.

11. The method according to claim 1, wherein fabricating the second gate and the source and drain comprise:

simultaneous filling of the gate cavity and the source and drain areas with a metallic material and chemical mechanical polishing so as to separate the second gate, source and drain.

12. The method according to claim 3, wherein fabricating the source and drain comprises a silicidation step.

13. A method for producing a field-effect transistor of planar structure, with double self-aligned gates on each side of a channel and metallic source and drain electrodes, wherein photolithographic steps relating to definition of the gates, source and drain areas and channel areas are all performed before bonding, the method comprising:

(a) forming a first gate on a first substrate of semi-conductor on insulator type, said first gate being encapsulated in a hard layer, (b) using said first gate to delineate the channel and a pad, (c) forming two dishes on each side of the first gate and the pad by depositing and patterning an insulating layer, said dishes being bounded by a bounding layer and being filled by an encapsulation oxide, (d) flipping and bonding said first substrate on a second substrate, (e) fabricating a second gate in a gate cavity, (f) etching at least partially said encapsulation oxide to form source and drain areas, (g) siliciding a portion of a layer making an electric connection between the portion of the channel situated between the self-aligned gates and the future source and drain electrodes, and (h) depositing a metal to form the entirely metallic source and drain electrodes.

* * * * *